(12) United States Patent
Cocchini

(10) Patent No.: US 6,910,196 B2
(45) Date of Patent: Jun. 21, 2005

(54) CLOCKED AND NON-CLOCKED REPEATER INSERTION IN A CIRCUIT DESIGN

(75) Inventor: Pasquale Cocchini, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 79 days.

(21) Appl. No.: 10/431,913

(22) Filed: May 8, 2003

(65) Prior Publication Data

US 2004/0225981 A1 Nov. 11, 2004

(51) Int. Cl.$^7$ .............................................. G06F 17/50
(52) U.S. Cl. ................................ 716/6; 716/9; 716/10; 716/13; 716/14; 703/16
(58) Field of Search ........................... 716/6, 9, 10, 13, 716/14; 703/16

(56) References Cited

U.S. PATENT DOCUMENTS

| | | | |
|---|---|---|---|
| 5,410,491 A | * | 4/1995 | Minami ......................... 716/6 |
| 5,557,779 A | * | 9/1996 | Minami ......................... 716/6 |
| 6,117,182 A | | 9/2000 | Alpert et al. ................... 716/8 |
| 6,807,520 B1 | * | 10/2004 | Zhou et al. .................... 703/14 |
| 2003/0014724 A1 | * | 1/2003 | Kojima et al. ................ 716/10 |

OTHER PUBLICATIONS

Lin et al., "Buffer size driven partitioning for HW/SW co-design", proceedings of International Conference on Computer Design: VLSI in Computers and Processors, Oct. 5, 1998, pp. 596–601.*

Chen et al., "An algorithm for zero–skew clock tree routing with buffer insertion", Proceedings of 1996 European Design and Te Conference, Mar. 11, 1996, pp. 230–236.*

Mehta et al., "Clustering and load balancing for buffered clock tree synthesis", 1997 IEEE International Conference on Comput Design: VLSI in Computers and Processors, Oct. 12, 1997, pp. 217–223.*

Lin et al., "Performance and interface buffer size driven behavioral partitioning for embedded systems", 1998 Ninth Internationa Workshop on Rapid System Prototyping, Jun. 3, 1998, pp. 116–121.*

Hassoun, Soha, et al., "Optimal Buffered Routing Path Constructions for Single and Multiple Clock Domain Systems", *IEEE No. 0–7803–7607–2/02*, IBM Austin Research Laboratory, Austin, TX, (2002), pp. 247–253.

Van Ginneken, Lukas P.P.P., "Buffer Placement in Distributed RC–tree Networks for Minimal Elmore Delay", *IEEE No. CH2868–8/90/0000–0*, IBM Thomas J. Watson Research Center, Yorktown Heights, New York, (1990), pp. 865–868.

* cited by examiner

*Primary Examiner*—Matthew Smith
*Assistant Examiner*—Phallaka Kik
(74) *Attorney, Agent, or Firm*—Schwegman, Lundberg, Woessner & Kluth, P.A.

(57) ABSTRACT

A method and apparatus to obtain minimum cycle latency and maximum required time at a driver for an assignment of clocked and non-clocked repeaters in a topology comprising, determining whether a node in the topology is a leaf, and assigning covers if the node is a leaf. Determining whether the node in the topology comprises one branch or two branches. Assigning covers to each node and eliminating inferior covers. Merging covers, and deleting inferior covers taking into account a difference in interconnect latency associated with the covers. The above method may be modified with a heuristic to insert repeaters in a topology for a given latency at each driver-receiver pair.

33 Claims, 9 Drawing Sheets

Compute $\gamma_{u,v}$ from $\gamma_v$ inserting a wire on branch $b_{u,v}$ wire($b_{u,v}$, $\gamma_v$)

1.            $\gamma_{u,v} = \phi$
2.            if slack $= r_v - R_{u,v}(C_{u,v} + c_v) \geq 0$
2.1          $\gamma_{u,v} = (2C_{u,v} + c_v, slack, \lambda_v, 0)$
3.            return $\gamma_{u,v}$ //Compute $\gamma_u$ joining $\gamma_{u,v}$ and $\gamma_{u,z}$

Join($\gamma_{u,v}$, $\gamma_{u,z}$)

1.       $\gamma_u = (c_{u,v} + c_{u,z}, \min(r_{u,v}, r_{u,z}), \max(\lambda_{u,v}, \lambda_{u,z}), a_{u,v} \cup a_{u,z})$
2.       return $\gamma_u$ // Compute a new $\gamma$ from $\gamma_{u,v}$ inserting repeater g repeat ($\gamma_{u,v}$, g)

1.           $\gamma = \phi$
2.           if slack $= r_{u,v} - delay(g, c_{u,v}) \geq 0$
2.1         if g is not clocked
2.1.1      $\gamma = (load(g), slack, \lambda_{u,v}, g)$
2.2         else if slack $- \sigma_{m,n} \geq 0$
2.2.1      $\gamma = (load(g), T_\varphi - T_{set-up}(g), \lambda_{u,v} + 1, g)$
3.           return $\gamma$

Fig. 4

//Compute optimal covers $\Gamma_u$ of sub-tree $\theta_u$ for min latency

MiLa ($\theta_u$)

1.    if $\theta_u$ is a leaf then $\Gamma_u = (c_u, r_u, 0, 0)$
2.    else if $\theta_u$ is a root that branches once to $b_{u,v}$
2.1         $\Gamma_v = \text{MiLa}(\theta_v)$
2.2         $\Gamma_v = U_{\gamma \in \Gamma_v}(wire(b_{u,v}, \gamma))$ //insert $|\Gamma_v|$ covers
2.3         $\Gamma_g = \Phi$
2.4         for each g in G       //insert $|G|$ covers
2.4.1            $\Gamma = U_{\gamma \in \Gamma_u}(repeat(\gamma_{u,v}, g))$
2.4.2            apply pruning rules to $\Gamma \Rightarrow \forall |\Gamma^k| = 1$
2.4.3            $\Gamma_g = \Gamma_g \cup \Gamma$
2.5         $\Gamma_u = \Gamma_u \cup \Gamma_g$
3.    else if $\theta_u$ root branches twice to $b_{u,v}$ and $b_{u,z}$
3.1         $\Gamma_{u,v} = \text{MiLa}(\theta_{u,v})$, $\Gamma_{u,z} = \text{MiLa}(\theta_{u,z})$
3.2         // $\Gamma_{u,v} \equiv \{\Gamma^x, \ldots \Gamma^y\}$, $\Gamma_{u,z} \equiv \{\Gamma^m, \ldots \Gamma^n\}$
3.3         if $y < n$ then swap($\Gamma_{u,v}, \Gamma_{u,z}$)
3.4         for $k = x - n$ to $y - m$ //latency shift operation
3.4.1            $\Gamma_u = \Gamma_u \cup merge(\Gamma_{u,v}, \{\Gamma^{m+k}, \ldots, \Gamma^{n+k}\})$
4.    apply pruning rules to $\Gamma_u$
5.    if $\theta_u = \theta_1$ then Traverse the tree from root up and compute the latency at each receiver
6.    return $\Gamma_u$

*Fig. 5*

//Join covers with same latency from $\Gamma_u$ and $\Gamma_v$ in $\Gamma$

//max $|\Gamma|=|\Gamma_u|+|\Gamma_v|$ merge $(\Gamma_u, \Gamma_v)$

1.      // $\gamma_j^i \equiv i-$ th element of $\Gamma_j$, $\lambda_j^i =$ latency of $\gamma_j^i$
2.      $\Gamma = \phi$, x = y = 1
3.      while $x \leq |\Gamma_u|$ and $y \leq |\Gamma_v|$
3.1      if $\lambda_u^x > \lambda_v^y$ then y = y + 1, goto 3.
3.2      if $\lambda_u^x > \lambda_v^y$ then x = x + 1, goto 3.
3.3      $\Gamma = \Gamma \cup \text{join}(\gamma_u^x, \gamma_v^y)$
3.4      if $r_u^x \leq r_v^y$ then x = x + 1
3.5      if $r_v^x \leq r_u^y$ then y = y + 1
4.      return $\Gamma$

*Fig. 6*

//Compute optimal covers $\Gamma_u$ of sub-tree $\theta_u$ given latency
//constraints $\lambda_u$ at each driver-receiver pair
GiLa ($\theta_u$)

1. if $\theta_u$ is a leaf then $\Gamma_u = (c_u, r_u, \lambda_u, 0)$
2. else if $\theta_u$ is a root that branches once to $b_{u,v}$
   2.1      $\Gamma_v$ = GiLa($\theta_v$)
   2.2      $\Gamma_v = U_{\gamma \in \Gamma_v}(wire(b_{u,v}, \gamma))$ //insert $|\Gamma_v|$ covers
   2.3      $\Gamma_g = \Phi$
   2.4      for each g in G      //insert $|G|$ covers
   2.4.1         $\Gamma = U_{\gamma \in \Gamma_u}(repeat(\gamma_{u,v}, g))$
   2.4.2         apply pruning rules to $\Gamma \Rightarrow \forall |\Gamma^k| = 1$
   2.4.3         $\Gamma_g = \Gamma_g \cup \Gamma$
   2.5      $\Gamma_u = \Gamma_u \cup \Gamma_g$
   2.6      if $\theta_u = \theta_1$ then
   2.6.1         if x > 0 then exit: the net is not feasible
   2.6.2         if y < 0 then //insert =y more flip-flops in $\Gamma_u$
   2.6.2.1            $\Gamma_u = Re\,Flop(\theta_u - y)$
3. else if $\theta_u$ root branches twice to $b_{u,v}$ and $b_{u,z}$
   3.1      $\Gamma_{u,v}$ = GiLa($\theta_{u,v}$), $\Gamma_{u,z}$ = GiLa($\theta_{u,z}$)
   3.2      //$\Gamma_{u,v} \equiv \{\Gamma^x, ... \Gamma^y\}, \Gamma_{u,z} \equiv \{\Gamma^m, ... \Gamma^n\}$
   3.3      if y < m then //insert m-y more flip-flop-flops in $\Gamma_{u,v}$
   3.3.1         $\Gamma_{u,v} = Re\,Flop(\theta_{u,v}, m-y)$
   3.4      if n < x then //insert x-n more flops in $\Gamma_{u,z}$
   3.4.1         $\Gamma_{u,z} = Re\,Flop(\theta_{u,z}, x-n)$
   3.5      $\Gamma_u = \Gamma_u \cup merge(\Gamma_{u,v}, \Gamma_{u,z})$
4. apply pruning rules to $\Gamma_u$
6. return $\Gamma_u$

Fig. 7

//Insert extra flip-flops in a branch rooted by sub-tree $\theta_u$

ReFlop($\theta_u$, extra_flops)

1. Traverse the tree from $\theta_u$ up removing sets $\Gamma$ along the way and computing the number crossed_flops of crossed flip-flops until either a leaf or a branch point of at least degree 2 is reached.

2. Traverse the tree down back to $\theta_u$ generating new sets $\Gamma$ using the wire and repeat functions but this time forcing the insertion in the branch of an exact number of flip-flops equal to crossed_flops + extra_flops. In particular, flip-flops are equally spaced along the branch so as to equally distribute the extra positive slack introduced. If there are more flip-flops to be inserted than available locations, extra flip-flops are inserted in already occupied locations.

3. return $\Gamma_u$

Fig. 8

CLOCKED AND NON-CLOCKED REPEATER INSERTION IN A CIRCUIT DESIGN

BACKGROUND

1. Field of the Invention

The present invention is related to the field of circuit design. In particular, the present invention is related to a method and apparatus to insert clocked and non-clocked repeaters in a circuit design.

2. Description of the Related Art

Interconnect optimization is a critical component of circuit design, and in particular, of Very Large Scale Integration (VLSI) circuit designs. As part of interconnect optimization of a VLSI circuit design, repeaters (e.g., buffers and inverters) are used to reduce interconnect delay and to meet transition time/noise constraints. However, merely using repeaters does not solve all timing requirements; for example, when wire delay is greater than a clock cycle, the addition of repeaters may not solve the timing constraints and the insertion of clocked repeaters (e.g. flip-flops and/or latches) is essential. In high-performance VLSI circuits a substantial number of interconnections are pipelined (spanning over more than one clock cycle), making the number of needed repeaters too large for manual design. Therefore, an automated tool to insert clocked repeaters, as well as non-clocked repeaters, in the circuit design is necessary to reduce the Register-Transfer-Level (RTL)-to-layout convergence time. This is important as current scaling trends indicate that the number of both clocked and non-clocked repeaters increases exponentially every process generation.

In pipelined interconnects at least two challenges are faced by circuit designers: a) The accurate prediction of the minimum latency that can be achieved between the blocks of a design, given the available routing resources of a semiconductor process, and b) The insertion of buffers and flip-flops in a large number of pipelined nets where interconnect and functional latency constraints are specified at-priori by the circuit designers.

BRIEF SUMMARY OF THE DRAWINGS

Example embodiments of the present invention are illustrated in the accompanying drawings. The accompanying drawings, however, do not limit the scope of the present invention. Similar references in the drawings indicate similar elements.

FIG. 4 illustrates the pseudo-code for operations used in cover computation according to one embodiment of the invention.

FIG. 5 illustrates the pseudo code for calculating the optimal set of covers $\Gamma_l$ using the minimum latency (MiLa) algorithm according to one embodiment of the invention.

FIG. 6 illustrates pseudo-code for a merge function according to one embodiment of the invention.

FIG. 7 illustrates pseudo-code for the given latency (GiLa) algorithm according to one embodiment of the invention.

FIG. 8 illustrates the pseudo-code for inserting extra flip-flops in a branch rooted by a sub-tree according to one embodiment of the invention.

DETAILED DESCRIPTION

Described is a method and apparatus to obtain minimum time latency, i.e. minimum cycle latency and maximum required time, at a driver for at least a simultaneous assignment of clocked (e.g., flip-flops and/or latches) and non-clocked repeaters in a topology, traversed from one or more receivers to a driver, comprising, determining whether a node in the topology is a leaf, assigning covers if the node is a leaf, and eliminating inferior covers taking into account a difference in interconnect latency associated with the covers. Determining whether a node in the topology comprises a branch, assigning covers to the node if the node comprises a branch and eliminating inferior covers taking into account a difference in interconnect latency associated with the covers. Determining whether a node in the topology comprises a first branch and a second branch, assigning covers to the node by swapping covers of the two branches if maximum latency of a first branch is less than maximum latency of a second branch, merging covers of the first branch and the second branch to form a merged branch; and eliminating inferior covers of the merged branch taking into account a difference in interconnect latency associated with the covers. At the end of the traversal, the optimal solutions are found at the driver. The above method may be modified with a heuristic to insert repeaters in a topology for a given latency at each driver-receiver pair.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to effect such feature, structure, or characteristic in connection with other embodiments whether or not explicitly described. Parts of the description are presented using terminology commonly employed by those of ordinary skill in the art to convey the substance of their work to others of ordinary skill in the art.

In the following description and claims, the terms "coupled" and "connected", along with derivatives such as "communicatively coupled" may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct physical contact with each other, but still co-operate or interact with each other.

Figure 1:
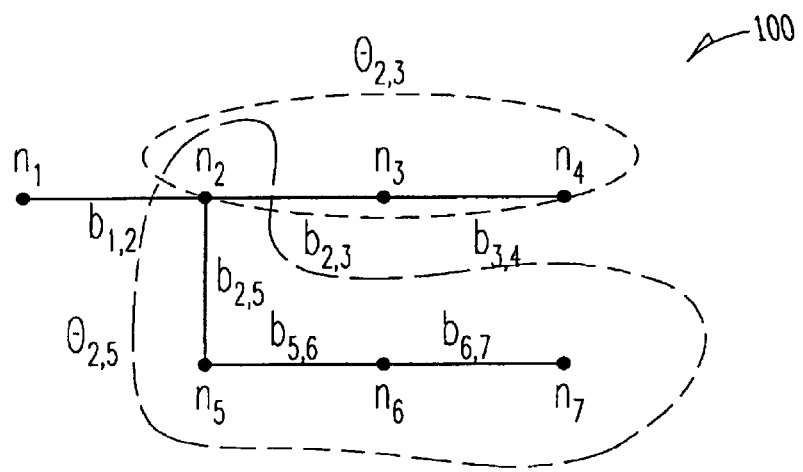
FIG. 1 illustrates a conventional routing tree topology.

FIG. 1 illustrates a conventional routing tree topology. As illustrated in FIG. 1, a conventional tree topology, 100, $\Theta=(N, B)$ comprises a set N of nodes $n_i$, where i=1 to n, and a set B of directed branches $b_{u,v}$ connecting node pairs (u, v), with u<v. The root and the leaves of the tree host the interconnect driver and receivers respectively. Other intermediate nodes are the candidate locations for the insertion of repeaters. Each node $n_i$ can also be thought of as the root of a sub-tree $\Theta_i \subseteq$ composed of all nodes and branches of $\Theta$ that can be reached from $n_i$, with $\Theta_i \equiv \Theta$ at the root of $\Theta$. At a branch point $n_i$ of degree 2, $\Theta_{i,y}$ and $\Theta_{i,z}$ are sub-trees rooted at $n_i$ composed of the portions of $\Theta_i$ departing from branches $b_{i,y}$ and $b_{i,z}$ respectively. In one embodiment of the invention, the routing tree structure of FIG. 1 can be used to represent interconnects with branching points of degree greater than two by introducing zero-length branches.

Figure 2:
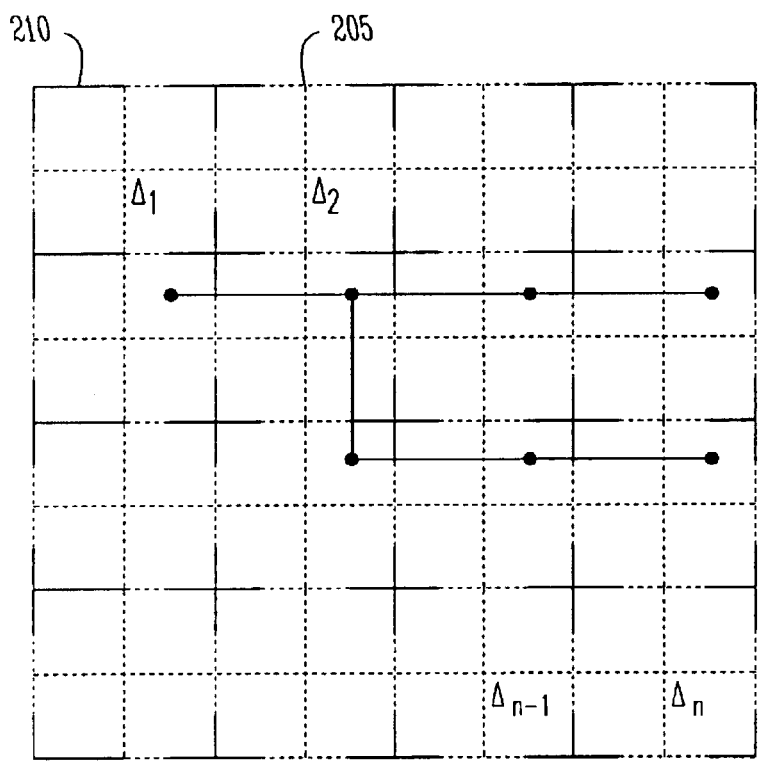
FIG. 2 illustrates a routing grid and a clock domain grid according to one embodiment of the invention.

FIG. 2 illustrates a routing grid and a clock domain grid according to one embodiment of the invention. As illustrated in FIG. 2, the routing grid 205 and clock domain grid 210 comprises a clock distribution network of a chip that may be modeled as a regular grid of n independent domains $\Delta_i$ distributed over the die of the chip. The clock skew may then be represented by an upper triangular matrix $\Sigma$ where an element $\sigma_{i,j}$ indicates the clock skew within domain $\Delta_i$ and an element $\sigma_{i,j}$ indicates the clock skew between domains $\Delta_i$ and $\Delta_j$. The location of the nodes of every $\Theta$ is then constrained to the center of the tiles of a finer regular routing grid superimposed on the clock distribution network grid. In the clock distribution network grid the size $l_{tile}$ of its tiles should be short enough to allow an effective insertion of repeaters. In particular, this is achieved by choosing a value two or more times shorter than a given process dependent repeater critical length $l_{crit}$. In one embodiment of the invention, $l_{crit}$ may be defined as the typical distance between the repeaters of a delay optimized two-pin interconnect routed over the most resistive metal layer used. Let $$L_{crit} = \frac{l_{crit}}{l_{tile}}$$

be such distance measured in terms of the clock distribution network grid tiles. The repeater delay is insensitive to local displacement, therefore, the center of a relatively small regular routing grid tile provides a good approximation for the real location of the repeater to be positioned anywhere within the tile.

Figure 3:
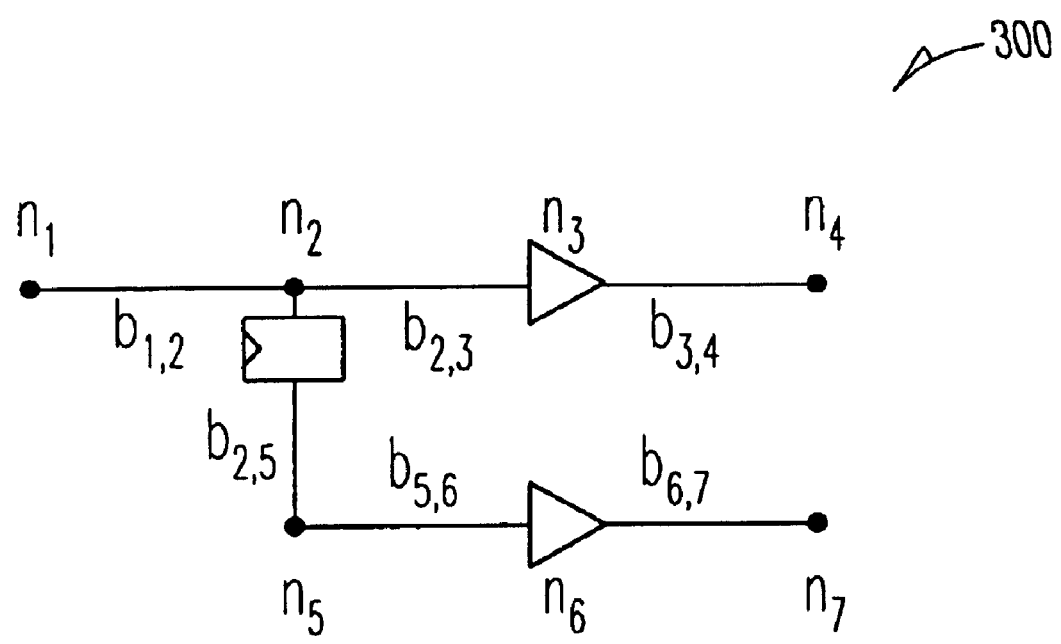
FIG. 3 illustrates a repeater assignment for the routing tree topology of FIG. 1 according to one embodiment of the invention.

FIG. 3 illustrates repeater assignment for the routing tree topology of FIG. 1 according to one embodiment of the invention. As illustrated in FIG. 3, repeater assignment 300 comprises interconnects, routed over a topology $\Theta$, that may be designed by allocating in the nodes and branches of the topology $\Theta$ routing resources such as wires of given metal layer, length, width, and repeater gates of given size. However, for simplicity it is assumed that all branches $b_{u,v}$ comprise wires of given length $l_{u,v}=l_{tile}$ having the same metal layer and fixed width. A repeater assignment $A_\Theta$ over topology $\Theta$ is then defined as a set of labels $a_{u,v}$ and $a_u$ where a value $a_{u,v}=g_k$ corresponds to the assignment of a repeater $g_k$, from a given gate library G, to branch $b_{u,v}$ after node $n_u$. A value of $a_{u,v}=0$ indicates that no repeater is inserted. For a node $n_u$ branching to two children $n_v$ and $n_z$ through branches $b_{u,v}$ and $b_{u,z}$, $a_u \equiv a_{u,v} \cup a_{u,z}$, whereas if $n_u$ has one child $n_v$, $a_u \equiv a_{u,v}$. Finally if $n_u$ is a leaf, $a_u=0$. This representation is also suitable for specifying a sizing solution of the interconnect driver and receivers.

In one embodiment of the invention, a wire of length $l_{u,v}$ routed over branch $b_{u,v}$ may be modeled with a resistance $R_{u,v}$ connected between nodes $n_u$ and $n_v$, and two capacitances of value $C_{u,v}$ connected between $n_u$ and ground and $n_v$ and ground respectively. If the wire has distributed resistance $R_l$ and distributed capacitance $C_l$, the lumped $R_{u,v}$ and $C_{u,v}$ can be calculated as $R_{u,v}=R_l l_{u,v}$, and $C_{u,v}=0.5 C_l l_{u,v}$.

If a repeater assignment is given for a routing tree $\Theta$ along with timing constraints at its leaves in terms of input load capacitance and propagation required time, the timing at the root of each sub-tree $\Theta_i$ of $\Theta$ needed to satisfy the constraints may be expressed by a 4-tuple $\gamma_i=(c_i,r_i,\lambda_i,a_i)$. $c_i$ is the input capacitance seen at the root, $r_i$ is the required arrival time after the positive edge of a clock signal $\phi$ with period $T_\phi$, $\lambda_i$ is the interconnect cycle latency defined as the maximum number of clocked repeaters crossed when going from the root of $\Theta_i$ to its leaves, and $a_i$ is the repeater assignment at $n_i$. A clocked repeater inserted at the root of $\Theta_i$ will increase its latency by one since the root is connected to the gate input. Since leaf $n_u$ of $\Theta$ is also the elementary tree $\Theta_u = (\{n_u\},\phi)$, the interconnect constraints at the receivers are also specified using a 4-tuple $\gamma_u=(c_u,r_u,0,0)$. Since $\gamma$ specifies the timing constraints and the allocated resources of an interconnect mapped onto the topology of sub-tree $\Theta$, the $\gamma$ interconnect is called the cover of $\Theta$. In general sub-tree $\Theta_i$ has a multiple number of feasible covers specifying different timing and resource assignments. For convenience, these covers are grouped per latency in the ordered set $\Gamma_i=\{\Gamma_i^m, \ldots, \Gamma_i^n\}$ with m, n≧0 and m<n, where $\Gamma_i^k=\{(c_l, r_l,k,a_l)\}, \ldots (c_n,r_n,k,a_n)\}$ is a set of covers of $\Theta_l$ with same latency k. In the case of a sub-tree $\Theta_u$ rooted at a branching point of degree two, $\gamma_{u,v}$ and $\gamma_{u,z}$ may be used to denote the covers of the sub-tree components $\Theta_{u,v}$ and $\Theta_{u,z}$ respectively.

Covers may be computed as follows: If the covers at the leaves of $\Theta$ are given as constraints and if assignment $A_\Theta$ is given, the cover of the sub-trees $\Theta_i$ may be recursively determined. The covers may be computed by starting from the leaves and ending at the root, using a hierarchical delay model such as Elmore which is well known by one having ordinary skill in the art. The covers may be computed using the wire and gate delay models discussed above using three operations wire, repeat and join.

FIG. 4 illustrates the pseudo-code for operations used in cover computation according to one embodiment of the invention. As illustrated in FIG. 4, if a node $n_u$ branches to node $n_v$ with a given $\gamma_v$ through branch $b_{u,v}$, cover $\gamma_u \equiv \gamma_{u,v}$ is calculated through operation wire, where $\gamma_{u,v}$ is back propagated to $n_u$ inserting a wire on branch $b_{u,v}$ using Elmore delay. The covers $\gamma$ are constrained by a fixed given clock cycle $T_\phi$. Therefore, only covers with non-negative required time are generated. Next, if a gate is inserted at $n_u$ operation repeat is called. A non-clocked repeater is inserted if the required time at its input is zero or positive. The new required time and the input capacitance of g are computed and stored in the cover while the latency remains unchanged. Similarly, a clocked repeater is inserted if the slack at its input is zero or positive. In particular, the slack is computed from the required time of the wire by subtracting the delay of the flip-flop and the term $\sigma_{m,n}$ that models the skew of the clock signal $\phi$ as defined above. Here, $\Delta_m$ is the clock domain where the flip-flop g is located and $\Delta_n$ is chosen among the domains of the upstream flip-flop so as to consider the worst case value of $\sigma_{m,n}$. If the slack is not negative, the required time at the input of the gate is set to the period of the clock minus the set-up time of gate g, and the latency of the new cover is increased by one.

When two covers $\gamma_{u,v}$ and $\gamma_{u,z}$ are back propagated to a branch node $n_u$ of degree two via operations wire and repeat, cover $\gamma_u$ is calculated by means of operation join. In join the input capacitance is the sum of the load seen at the two ranches and the required time is the minimum of the required time of $\gamma_{u,y}$ and $\gamma_{u,z}$ to account for the worst case. On the other hand, to propagate the correct value of latency to the root, the latency of the joined cover is the maximum of the latencies of the merging branches.

When multiple covers are computed for a sub-tree $\Theta$, each one corresponding to a different assignment of repeaters at the candidate locations, those non-inferior covers that lead to optimal solutions at the root of $\Theta$ are saved. Thus, inferior covers are pruned in accordance with the pruning rules illustrated below as follows: $\forall \gamma \in \Gamma$, $\gamma$ is inferior in $\Gamma$ if $\exists \dot\gamma \in \Gamma$ such that at least one of the following is true:

a. $\lambda = \dot\lambda, c \geq \dot c, r < \dot r$
b. $\lambda = \dot\lambda, c > \dot c, r = \dot r$
c. $\lambda = \dot\lambda, c = \dot c, r = \dot r, cost(\gamma) > cost(\dot\gamma)$
d. $\lambda > \dot\lambda, c \geq \dot c, r \leq \dot r$
e. $\forall \lambda, \forall c, r < 0$ From a and b above noted that $\gamma$ is an inferior cover since any gate driving a sub-tree $\Theta$ with cover $\gamma$ has input required time that is worse than that of the same gate driving $\Theta$ with $\dot\gamma$, while having the same input capacitance and the same latency. When $\gamma$ and $\dot\gamma$ have identical input capacitance and required time, as in c above, $\gamma$ is also inferior if the value of a user specified cost function associated with the routing resources allocated in $\Theta$ by $\gamma$, e.g., repeater area, is greater than that of $\dot\gamma$. When $\gamma$ has latency higher than that of $\dot\gamma$, as seen in d above, $\gamma$ is inferior for the same reasons as in a and b, and when it has identical input capacitance and required time, because $\gamma$ covers sub-tree $\Theta$ with same timing as in $\dot\gamma$ but wasting an extra clock cycle. Finally, when the required time is negative regardless of latency and input capacitance, as in rule e above, cover $\gamma$ is inferior because it does not meet the basic timing constraint of a clocked system where the required time is bounded from zero to a maximum equal to the clock period.

A method to calculate an optimal set of covers $\Gamma_I$ with minimum cycle latency and maximum required time at the driver of $\theta_I = \Theta$, inserting clocked and non-clocked repeaters according to the pruning rules described above is now illustrated. Given an interconnect topology $\Theta$ mapped onto a routing grid and a clock grid with skew matrix $\Sigma$, timing constraints at the receivers in terms of $\gamma_u = (c_u, r_u, 0, 0)$, and a library G of clocked and non-clocked repeaters.

Figure 9:
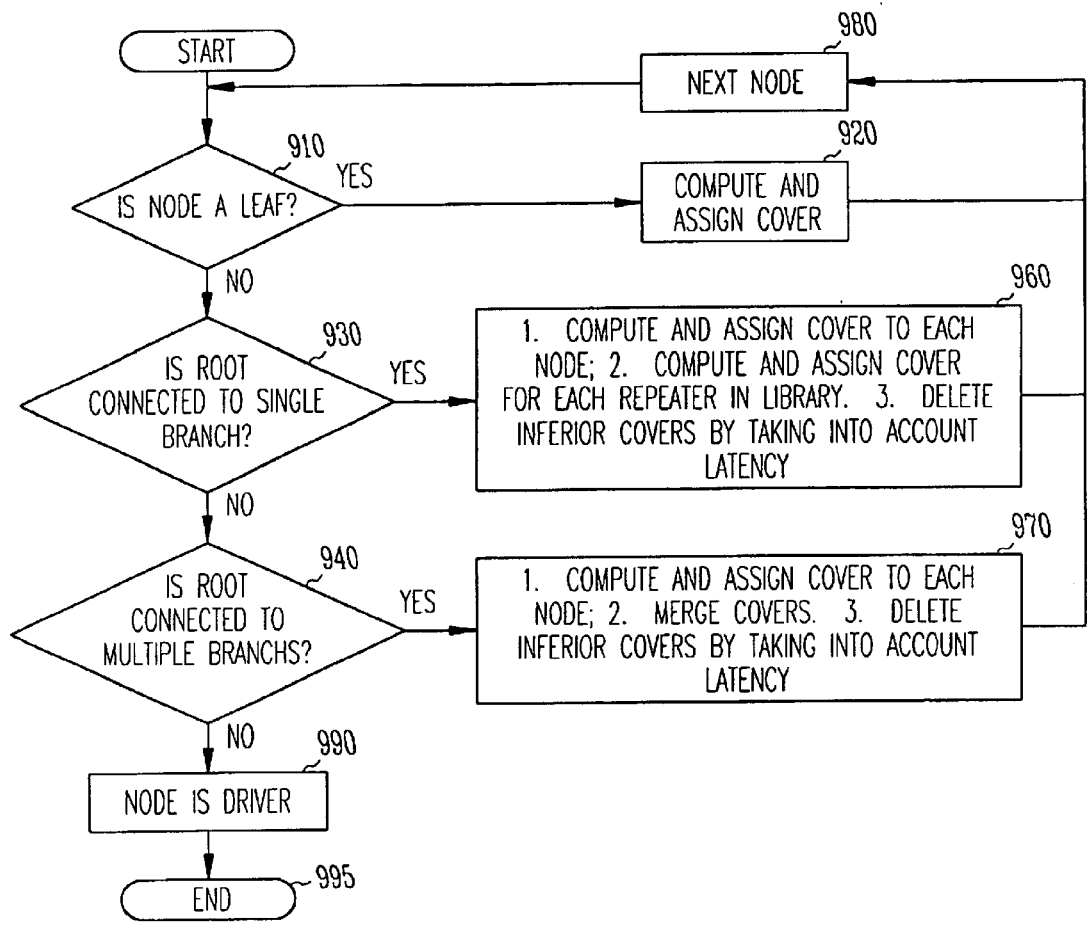
FIG. 9 illustrates a flow diagram for calculating the optimal set of covers using the MiLa algorithm of FIG. 5 according to one embodiment of the invention.

FIG. 5 illustrates the pseudo code for calculating the optimal set of covers $\Gamma_I$ using the MiLa algorithm according to one embodiment of the invention. FIG. 9 illustrates a flow diagram for calculating the optimal set of covers using the MiLa algorithm of FIG. 5 according to one embodiment of the invention). As illustrated in FIGS. 5 and 9, minimizing the latency in $\Gamma_I$ corresponds to minimizing the signal latency at the most latent receiver of the net. Also, the latency values $\lambda_u$ at the receivers are set to zero for convenience. In practice, the operation of the MiLa algorithm is independent of the $\lambda_u$ values, as they may be set to any arbitrary integer number different from each other. The real latency at each receiver is computed later by traversing the tree from root to leaves and computing the number of crossed flip-flops. The optimal covers at each node of the tree are computed recursively after multiple nested calls, starting from the leaves and ending at the root, traversing the tree in a depth first fashion. At any call of the MiLa algorithm, as illustrated in line 1 of FIG. 5 and 910 of FIG. 9, a determination is made if $\theta_u$ is a leaf, and if so at 920 the given constraint at the corresponding receiver $\Gamma_u = \{(c_u, r_u, 0, 0)\}$ is returned. The process flows to 980 wherein the next node is examined. If the root of $\theta_u$ is connected to a single branch $b_{u,v}$, as illustrated in line 2.1 and 930, the algorithm is called again to compute the optimal covers $\Gamma_v$ of the next sub-tree $\theta_v$. In section 2 and 960, the covers are propagated in line 2.2 to node $n_u$ inserting wires. Next, in loop 2.4 an additional cover is inserted in $\Gamma_u$ for each repeater of library G. To do this, all the covers computed in line 2.2 are repeated using the same repeater gate g calling operation repeat thus generating the new set $\Gamma$. Inferior covers are then deleted according to the pruning rules discussed above leaving $\Gamma$ with only one optimal cover for every available sub-set $\Gamma^k \subseteq$ with latency k. Here $|\Gamma|$ is equal to one, since all its covers prior to applying the pruning rules originated with the same repeater. At 2.5 in the pseudo-code of FIG. 5, $\Gamma_u$ is updated by adding the repeated covers computed. Thereafter the process flows to 980 wherein the next node is examined.

Section 3 and 940 of FIG. 9 of the MiLa algorithm computes the optimal covers of sub-tree $\theta_u$ when its root is connected to two branches $b_{u,v}$ and $b_{u,z}$. FIG. 6 illustrates pseudo-code for a merge function according to one embodiment of the invention. The merge function merges the covers from the two branches $b_{u,v}$ and $b_{u,z}$. The merge function assumes that the covers in sets $\Gamma_u$ and $\Gamma_v$ are sorted by increased latency and within each latency, by increasing required time and capacitance. A cover not featuring a monotonic increasing behaviour is an inferior one according to the pruning rules and is deleted prior to the merge procedure of the pseudo-code of FIG. 6.

At 970 of FIG. 9 and in the MiLa algorithm pseudo code, at line 3.1 the algorithm calls itself twice to compute the covers of sub-trees $\theta_{u,v}$ and $\theta_{u,z}$. At 3.2 in the MiLa algorithm pseudo code the corresponding sets $\Gamma_{u,v}$ and $\Gamma_{u,z}$ is composed of an arbitrary number of sub-sets $\Gamma^k$ of different latency k, where k is equal to the max latency at the root of each branch. Similar to the cover latency $\lambda$ defined in section 2 of the MiLa algorithm the signal latency at any node of an interconnect can be defined as the number of flip-flops crossed to reach the node starting from the driver where the signal latency is zero. While the algorithm minimizes the signal latency at the most latent receiver, it also determines the signal latency at other receivers such that optimal covers are obtained and propagated back to the driver. To do so, all combinations of the subsets $\Gamma^k \subset \Gamma_{u,v}$ and $\Gamma^h \subset \Gamma_{u,z}$ are joined so that for each couple $(\Gamma^k, \Gamma^h)$ a new joined sub-set $\Gamma^q \subset \Gamma_u$ is generated with function merge where $q = \max(k, h)$. For example, a value $q = k$ corresponds to the case of joined covers of $\Gamma_u$, with latency k where the h-latency covers of $\Gamma_{u,z}$ have been shifted in time by latency k–h (i.e., by using a latency shift operation). The general case is implemented in loop 3.4 of the MiLa algorithm where shifts in latency are generated and the joined covers of $\Gamma_{u,v}$ computed by function merge. Here, because of line 3.3 in the MiLa algorithm pseudo code, set $\Gamma_{u,v}$ is the one that contains covers with maximum latency. Therefore, in line 3.4.1, only the covers of $\Gamma_{u,z}$ need to be shifted by latency k to consider all possible cases. After determining the optimal covers $\Gamma_u$ for each case of branching degree at the root of $\theta_u$ in line 4, set $\Gamma_u$ is pruned of its inferior elements according to the pruning rules. In line 5 the optimal set $\Gamma_u$ is returned. Thereafter, the process flows to 980 wherein the next node is examined.

After the first call to MiLa returns, the optimal cover set $\Gamma_I$ of the whole interconnect is computed, and for each $\gamma_i \in \Gamma_I$ with minimum latency the corresponding repeater assignment and the signal latency at receivers are found by traversing, from root on, all the component covers from which the $\gamma_i$ at the driver was back propagated. At 990, the process determines that the node being examined is a driver. The MiLa algorithm ends at 955.

As mentioned above, a set $\Gamma_u$ can be represented as $\Gamma_u = \{\Gamma_u^k, \ldots, \Gamma_u^{k+n-1}\}$, where non-inferior covers are ordered in increasing $\lambda$ identifying n latency subsets $\Gamma_u^i$, with $i=k, \ldots, k+n-1$. In practice, for a choice of tile size $l_{tile}$, it can be experimentally verified that covers in subsets $\Gamma_u^{k+m}$ with $m \geq 2$ do not participate in producing optimal solutions at the driver, suggesting that the covers in $\Gamma u^{k+1}$ have always enough high required time and low capacitance to provide for back-up solutions when covers in $\Gamma_u^k$ cannot be propagated because of property 4.3. In this context a practical solution to reduce the run-time without affecting optimality is that of avoiding the generation of covers $\Gamma_u^{k+m}$ with $m \geq 2$ in any set $\Gamma u$, therefore setting an upper bound of 2 to the number of latency subsets. In particular, this can be achieved in MiLa by allowing in line 2.4.1 the insertion of clocked repeaters only to the covers $\Gamma_u^k$ with lowest latency in $\Gamma_u = \{\Gamma_u^k, \Gamma_u^{k+1}\}$.

The optimality of the MiLa algorithm is proved by induction on the sequence of recursive computations of cover sets $\Gamma_u$ generated by the depth first traversal induced by the first call to $\theta_l$. Therefore, assuming that the given covers $\Gamma$ at the receivers are optimal, one only has to prove the optimality of the covers produced by one recursive call to section 2 or 3 of the MiLa algorithm. However, both sections 2 and 3 produce a cover set $\Gamma_u$ containing among its elements possible optimal solutions according to the problem formulation. The optimality of all the covers of $\Gamma_u$ is then ensured by the application of the pruning rules which eliminate inferior elements.

The MiLa algorithm solves the non-clocked repeater problem if no flip-flops are included in the repeater library G. In this case, the time complexity of the algorithm is $O(L_{crit}|G||B|)$, where $L_{crit}$ is the repeater critical length defined with respect to FIG. 2 above and $|B|$ the number of branches in the routing tree, in contrast with the complexity $O(|B|^2)$ illustrated in the van Ginneken algorithm, well known by one having ordinary skill in the art. In the van Ginneken algorithm only one buffer is used and $L_{crit}$ is not considered. In practice, this quadratic complexity is mitigated in the method illustrated by the MiLa algorithm by the repeater critical length $L_{crit}$ that effectively limits the size of the cover sets $\Gamma$ to $O(L_{crit}|G|)$. Intuitively this is explained by considering the number of covers originated from a set $\Gamma$, back propagated through $L_{crit}$ degree-1 branches, containing $|G|$ covers each one corresponding to one element of library G. At every branch, line 2.4 of MiLa algorithm adds $|G|$ extra covers until the last branch is reached after $L_{crit}$ times. Here, a total number of $(1+L_{crit})|G|$ covers collapse into a maximum of $|G|$ distinct non-inferior covers since a repeater is always inserted after $L_{crit}$ tiles. The same situation applies if the covers originated from $\gamma$ are back propagated through a branch point with degree 2, since in this case the maximum size of set $\Gamma$ is also limited to the sum of the sizes of its merging sets. In the case of latent interconnects, that is when $|G|$ also contains flip-flops, the complexity does not increase even though the typical run-time is at least twice as much as that of the no latent interconnect case. Particularly, as explained above, this is due to the fact that the size of every cover set $\Gamma_u = \{\Gamma^k, \Gamma^{k+1}\}$ is still $O(L_{crit}|G|)$ as it is the size of its two component sub-sets $\Gamma^k$ and $\Gamma^{k+1}$. Furthermore, in the case of branch points with degree two, the merging operation of section 3.4 of MiLa results in a cover set $\Gamma_u$ with upper bound size $|\Gamma_u| = 2(|\Gamma_{u,v}| + |\Gamma_{u,z}|)$.

The MiLa algorithm can also perform driver and receiver sizing concurrently to repeater insertion. Gate sizing at the receivers is achieved by specifying a constraint set of covers $\Gamma_u$ for every receiver where each element $\gamma_i = (c_i, r_i, 0, a_i = g)$ corresponds to the selection of a gate g with given size. After running the MiLa algorithm, the repeater assignment of available optimal cover at the driver also includes labels $a_i$ corresponding to the best choice of gates at the receivers. The best sizes of a driver gate is then selected if the covers of the optimal set $\Gamma_l$ at the root of $\Theta$ are run once through loop 2.4 of the MiLa algorithm where each gate g in G corresponds to a different size of the driver gate.

After the micro architecture design is complete, all latencies are fixed and therefore all interconnects are designed so as to abide by given latency requirements. To this purpose the MiLa algorithm is modified into a new algorithm called GiLa algorithm to accept such given latency constraints and perform repeater insertion with the same underlying methodology, using a simple and effective heuristic to resolve latency mismatch occurrences at intermediate points.

FIG. 7 illustrates the GiLa algorithm according to one embodiment of the invention. As illustrated in FIG. 7, the formulation of the assignment for the given latency problem is as follows. Given an interconnect topology $\Theta$ mapped onto a routing grid and a clock grid with skew matrix $\Sigma$, timing constraints at the receivers in terms of $\gamma_u \equiv (c_u, r_u, \lambda_u, 0)$, a library G of clocked and non-clocked repeaters, find a set of covers $\Gamma_l$ at the driver of $\theta_l = \Theta$ that satisfy timing constraints at driver and receivers. In addition to capacitance and required time constraints, as is seen in the case of the MiLa algorithm, each receiver is given a latency constraint $\lambda_u$ corresponding to the latency between the receiver and the driver with inverted sign. The latency $\lambda_l$ at the driver is set to be zero. For example, the latency constraints of the assignment of FIG. 3 are $\lambda_l = 0$, $\lambda_4 = 0$, and $\lambda_7 = -1$. Using negative numbers to express the latency at the receivers allows one to reuse operations join and repeat in GiLa without modification. As in the case of MiLa, the covers $\Gamma_l$ solutions of the problem are computed calling GiLa with argument $\theta_l$. GiLa proceeds in the same way as MiLa except when branch points of degree two are reached in section 3 of the algorithm. In GiLa, if the computed sets $\Gamma_{u,v}$ and $\Gamma_{u,z}$ have covers with the same latency, then function merge is called in line 3.5 and the merged set $\Gamma_u$ is returned after being pruned of inferior solutions. However, if no such covers exist, the difference in latency between the two branches is computed, and the sub-tree with lowest latency recomputed in line 3.3.1 for $\theta_{u,v}$ or 3.4.1 for $\theta_{u,z}$ by function ReFlop as illustrated in the pseudo code of FIG. 8, so that the latency of that branch is augmented by the corresponding difference. Function ReFlop implements a simple heuristic to insert the needed extra flip-flops in the processed branch. The effectiveness of function ReFlop relies on the following observation: if the covers $\Gamma_u$ computed for minimum latency at the root of a sub-tree $\theta_u$ meet their timing constraints with less latency than requested, it is always possible to meet the same timing constraints also inserting extra flip-flop gates to increase the latency of the branch rooted at $\theta_u$. Furthermore, to avoid wasting unnecessary area, extra flip-flops are not inserted after a branching point of degree two as that would lead to the use of two flip-flops for the gain of a latency value of only one. After reaching the root of $\Theta$, in section 2.6 GiLa also checks that the solution set $\Gamma_l$ has covers with latency zero, corresponding to meeting the latency constraints specified at the receivers. If all covers have latency greater than 0, then the latency constraints are infeasible as no solution can be achieved with fewer flip-flops. However, if all covers have latency less than 0, ReFlop is called to insert the needed extra flip-flops. In essence, with the adoption of the ReFlop heuristic, assignment solutions meeting required latency constraints are built, starting from solutions with minimum latency produced by the underlying engine of MiLa in which latency mismatch instances at driver and branch points are resolved by inserting the minimum needed number of flip-flops to meet the given constraints.

Figure 10:
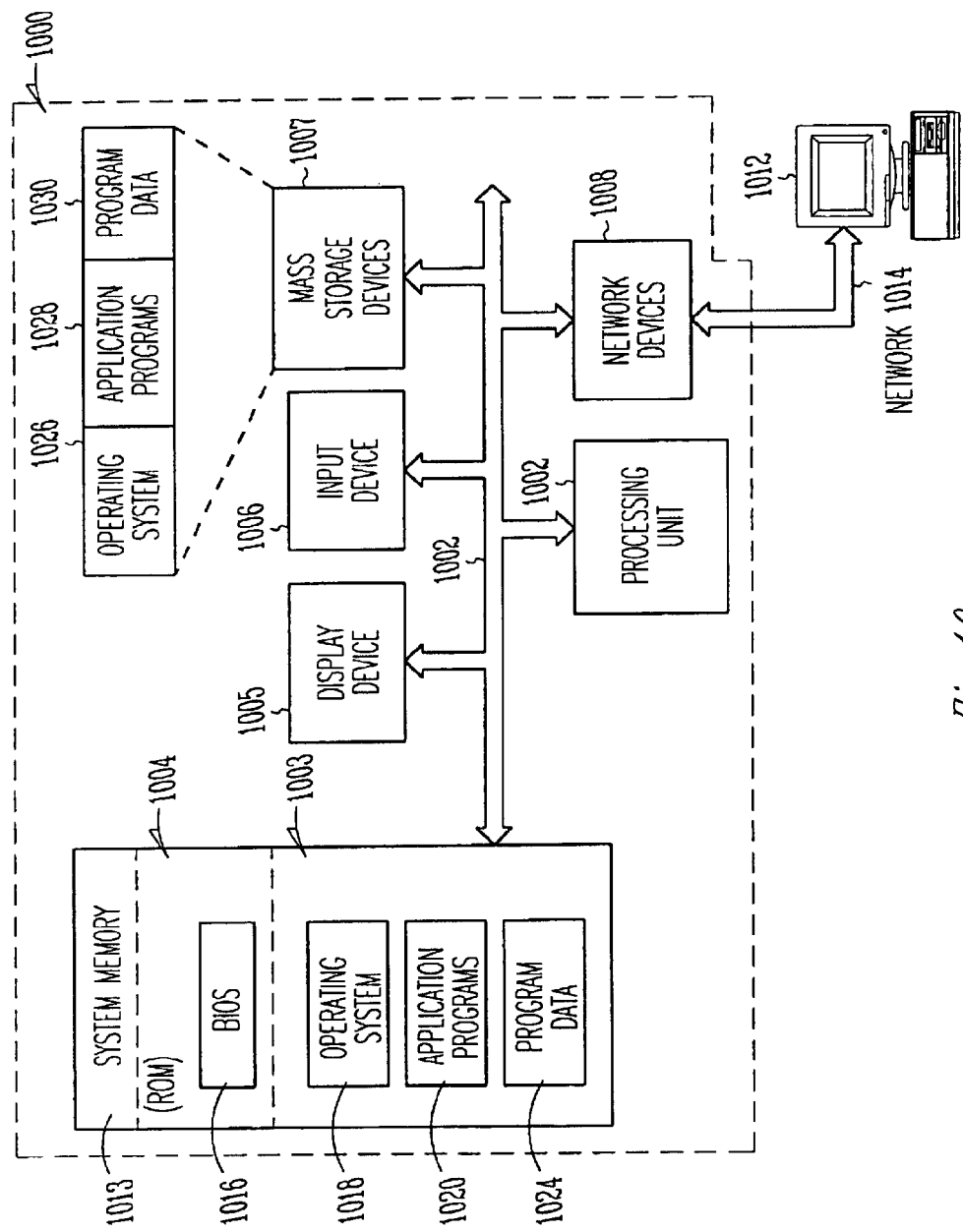
FIG. 10 illustrates a computer system for computing optimal covers for minimum latency and for computing optimal covers for a given latency according to one embodiment of the invention.

FIG. 10 illustrates a computer system for computing optimal covers for minimum latency and for computing optimal covers for a given latency according to one embodiment of the invention. In general, the computer system 1000 may comprise a processing unit 1002 communicatively coupled through a bus 1001 to system memory 1013, mass storage devices 1007, Input devices 1006, display device 1005 and network devices 1008.

Bus 1001 may be any of several types of bus structures including a memory bus, a peripheral bus, and a local bus using any of a variety of bus architectures. System memory 1013 comprises a read only memory (ROM) 1004 and random access memory (RAM) 1003. ROM 1004 comprises basic input output system (BIOS) 1016. BIOS 1016 contain the basic routines, e.g., start up routines, that facilitate the transfer of information between elements within computer system 1000. RAM 1003 includes cache memory and comprises operating system 1018, application programs 1020, and program data 1024. Application programs 1020 include the program code for implementing the method to insert repeaters in a circuit design as described with respect to FIGS. 2–9 above. Program data 1024 may include data generated by application programs 1020. Mass storage device 1007 represents a persistent data storage device, such as a floppy disk drive, fixed disk drive (e.g., magnetic, optical, magneto-optical, or the like), or streaming tape drive. Mass storage device 10707 may store application programs 1028, operating system 1026 for computer system 1000, and program data 1030. Application programs 1028 and program data 1030 stored on mass storage devices 1007 may include the application programs 1020 and program data 1024 stored in RAM 1003. One embodiment of the invention may be stored entirely as a software product on mass storage device 1007. Embodiments of the invention may be represented as a software product stored on a machine-readable medium (also referred to as a computer-accessible medium, a machine-accessible medium, or a processor-accessible medium). The machine-readable medium may be any type of magnetic, optical, or electrical storage medium including a diskette, CD-ROM, memory device (volatile or non-volatile), or similar storage mechanism. The machine-readable medium may contain various sets of instructions, code sequences, configuration information, or other data. Those of ordinary skill in the art will appreciate that other instructions and operations necessary to implement the described invention may also be stored on the machine-readable medium. One embodiment of the invention may be embedded in a hardware product, for example, in a printed circuit board, in a special purpose processor, or in a specifically programmed logic device communicatively coupled to bus 1001. Processing unit 1002 may be any of a wide variety of general-purpose processors or microprocessors (such as the Pentium® processor family manufactured by Intel® Corporation), a special purpose processor, or a specifically programmed logic device. Processing unit 1002 is operable to receive instructions which, when executed by the processing unit cause the processing unit to execute application programs 1020.

Display device 1005 is coupled to processing unit 1002 through bus 1001 and provides graphical output for computer system 1000. Input devices 1006 such as a keyboard or mouse are coupled to bus 1001 for communicating information and command selections to processing unit 1002. Other input devices may include a microphone, joystick, game pad, scanner, or the like. Also coupled to processing unit 1002 through bus 1001 is an input/output interface (not shown) which can be used to control and transfer data to electronic devices (printers, other computers, etc.) connected to computer system 1000. Computer system 1000 includes network devices 1008 for connecting computer system 1000 to one or more remote devices (e.g., the receiving node) 1012 via network 1014. Remote device 1012 may be another personal computer, a server, a router, a network PC, a wireless device or other common network node and typically includes one or more of the elements described above with respect to computer system 1000. Network devices 1008, may include a network interface for computer system 1000, Ethernet devices, network adapters, phone jacks, modems, and satellite links. It will be apparent to one of ordinary skill in the art that other network devices may also be utilized.

Thus, a method and apparatus for inserting clocked and non-clocked repeaters in a circuit design has been disclosed. While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A method to obtain minimum cycle latency and maximum required time at a driver for an assignment of clocked and non-clocked repeaters in a topology comprising:

traversing the topology from one or more receivers to a driver;

determining whether a node in the topology is a leaf, assigning covers if the node is a leaf, and eliminating inferior covers taking into account a difference in interconnect latency associated with the covers;

determining whether the node in the topology comprises a branch, assigning covers to the node if the node comprises a branch by inserting wires and clocked and non-clocked repeaters, and eliminating inferior covers taking into account a difference in interconnect latency associated with the covers;

determining whether the node in the topology comprises a first branch and a second branch, assigning covers to the node by swapping covers of the two branches if maximum latency of the first branch is less than maximum latency of the second branch;

merging covers of the first branch and the second branch to form a merged branch; and eliminating inferior covers of the merged branch taking into account a difference in interconnect latency associated with the covers.

2. The method of claim 1 wherein assigning covers comprises:

computing a 4-tuple defined as $\gamma_i=(c_i,r_i,\lambda_i,a_i)$ where $c_i$ is an input capacitance seen at node i, $r_i$ is a required arrival time at a node after a positive edge of a clock signal $\phi$ with period $T_\phi$, $\lambda_i$ is the interconnect latency defined as a maximum number of clocked repeaters crossed when going from the driver of $\Theta_i$ to the receiver, and $a_i$ is the repeater assignment at the node.

3. The method of claim 2 wherein computing a 4-tuple defined as $\gamma_i=(c_i,r_i,\lambda_i,a_i)$ comprises using a clock skew matrix to compute the 4-tuple.

4. The method of claim 3 wherein using the clock skew matrix to compute the 4-tuple comprises modeling a clock distribution network of a die as a grid of n independent domains $\Delta_i$ distributed over the die; and representing the clock skew as an upper triangular matrix $\Sigma$ where an element $\sigma_{i,j}$ in the grid represents the clock skew between domains $\Delta_i$ and $\Delta_j$.

5. The method of claim 2 wherein eliminating inferior covers comprises given $\gamma$ and $\dot\gamma$ as covers in a set of covers $\Gamma$, $\gamma$ is an inferior cover in $\Gamma$ if at least one pruning rule is true, said pruning rule comprising:
   a. $\lambda=\dot\lambda, c \geq \dot c, r < \dot r$
   b. $\lambda=\dot\lambda, c > \dot c, r = \dot r$
   c. $\lambda=\dot\lambda, c = \dot c, r = \dot r, \text{cost}(\gamma) > \text{cost}(\dot\gamma)$
   d. $\lambda > \dot\lambda, c \geq \dot c, r \leq \dot r$
   e. $\forall \lambda, \forall c, r < 0$.

6. The method of claim 1 wherein merging covers of the first branch and the second branch to form a merged branch comprises merging covers of the first branch and the second branch using a latency shift operation.

7. A system to obtain minimum cycle latency and maximum required time at a driver for an assignment of clocked and non-clocked repeaters in a topology comprising:
   a memory;
   a processor; and
   a bus coupled to the memory and the processor, the processor to
   traverse the topology from one or more receivers to a driver;
   determine whether a node in the topology is a leaf, assign covers if the node is a leaf, and eliminate inferior covers taking into account a difference in interconnect latency associated with the covers;
   determine whether the node in the topology comprises a branch, assign covers to the node if the node comprises a branch by inserting wires and clocked and non-clocked repeaters and eliminate inferior covers taking into account a difference in interconnect latency associated with the covers;
   determine whether the node in the topology comprises a first branch and a second branch, assign covers to the node by swapping covers of the two branches if maximum latency of the first branch is less than maximum latency of the second branch;
   merge covers of the first branch and the second branch to form a merged branch; and
   eliminate inferior covers of the merged branch taking into account a difference in interconnect latency associated with the covers.

8. The system of claim 7 wherein the processor to assign covers comprises: the processor to
   compute a 4-tuple defined as $\gamma_i=(c_i,r_i,\lambda_i,a_i)$ where $c_i$ is an input capacitance seen at node i, $r_i$ is a required arrival time at a node after a positive edge of a clock signal $\phi$ with period $T_\phi$, $\lambda_i$ is the interconnect latency defined as a maximum number of clocked repeaters crossed when going from the driver of $\Theta_i$ to the receiver, and $a_i$ is the repeater assignment at the node.

9. The system of claim 8 further comprising, the processor to compute the 4-tuple defined as $\gamma_i=(c_i,r_i,\lambda_i,a_i)$ using a clock skew matrix to compute the 4-tuple.

10. The system of claim 9 wherein the processor to use the clock skew matrix to compute the 4-tuple comprises the processor to model a clock distribution network of a die as a grid of n independent domains $\Delta_i$ distributed over the die; and to represent the clock skew as an upper triangular matrix $\Sigma$ where an element $\sigma_{i,j}$ in the grid represents the clock skew between domains $\Delta_i$ and $\Delta_j$.

11. The system of claim 8 wherein the processor to eliminate inferior covers comprises given $\gamma$ and $\dot\gamma$ as covers in a set of covers $\Gamma$, the processor to eliminate $\gamma$ as an inferior cover in $\Gamma$ if at least one pruning rule is true, said pruning rule comprising:
   a. $\lambda=\dot\lambda, c \geq \dot c, r < \dot r$
   b. $\lambda=\dot\lambda, c > \dot c, r = \dot r$
   c. $\lambda=\dot\lambda, c = \dot c, r = \dot r, \text{cost}(\gamma) > \text{cost}(\dot\gamma)$
   d. $\lambda > \dot\lambda, c \geq \dot c, r \leq \dot r$
   e. $\forall \lambda, \forall c, r < 0$.

12. The system of claim 7 wherein the processor to merge covers of the first branch and the second branch to form a merged branch comprises the processor to merge covers of the first branch and the second branch using a latency shift operation.

13. An article of manufacture to obtain minimum cycle latency and maximum required time at a driver for an assignment of clocked and non-clocked repeaters in a topology comprising:
   a machine-accessible medium including instructions that, when executed by a machine, causes the machine to perform operations comprising:
   traversing the topology from one or more receivers to a driver;
   determining whether a node in the topology is a leaf, assigning covers if the node is a leaf, and eliminating inferior covers taking into account a difference in interconnect latency associated with the covers;
   determining whether the node in the topology comprises a branch, assigning covers to the node if the node comprises a branch by inserting wires and clocked and non-clocked repeaters and eliminating inferior covers taking into account a difference in interconnect latency associated with the covers;
   determining whether the node in the topology comprises a first branch and a second branch, assigning covers to the node by swapping covers of the two branches if maximum latency of the first branch is less than maximum latency of the second branch;
   merging covers of the first branch and the second branch to form a merged branch; and
   eliminating inferior covers of the merged branch taking into account a difference in interconnect latency associated with the covers.

14. The article of manufacture of claim 13 wherein instructions for assigning a cover comprise further instructions for
   computing a 4-tuple defined as $\gamma_i=(c_i,r_i,\lambda_i,a_i)$ where $c_i$ is an input capacitance seen at node i, $r_i$ is a required arrival time at a node after a positive edge of a clock signal $\phi$ with period $T_\phi$, $\lambda_i$ is the interconnect latency defined as a maximum number of clocked repeaters crossed when going from the driver of $\Theta_i$ to the receiver, and $a_i$ is the repeater assignment at the node.

15. The article of manufacture of claim 14 wherein instructions for computing a 4-tuple defined as $\gamma_i=(c_i,r_i,\lambda_i,a_i)$ comprise further instructions for using a clock skew matrix to compute the 4-tuple.

16. The article of manufacture of claim 15 wherein instructions for using the clock skew matrix to compute the 4-tuple comprise further instructions for modeling a clock distribution network of a die as a grid of n independent domains $\Delta_i$ distributed over the die; and representing the clock skew as an upper triangular matrix $\Sigma$ where an element $\sigma_{i,j}$ in the grid represents the clock skew between domains $\Delta_i$ and $\Delta_j$.

17. The article of manufacture of claim 14 wherein said instructions for eliminating inferior covers comprise further instructions for eliminating inferior covers comprising, given $\gamma$ and $\dot\gamma$ as covers in a set of covers $\Gamma$, $\gamma$ is an inferior cover in $\Gamma$ if at least one pruning rule is true, said pruning rule comprising:

a. $\lambda=\dot\lambda, c\geq\dot c, r<\dot r$
   b. $\lambda=\dot\lambda, c>\dot c, r=\dot r$
   c. $\lambda=\dot\lambda, c=\dot c, r=\dot r$, cost($\gamma$)>cost($\dot\gamma$)
   d. $\lambda>\dot\lambda, c\geq\dot c, r\leq\dot r$
   e. $\forall\lambda, \forall c, r<0$.

18. The article of manufacture of claim 13 wherein said instructions for merging covers of the first branch and the second branch to form a merged branch comprise further instructions for merging covers of the first branch and the second branch using a latency shift operation.

19. A method to insert one or more repeaters in a topology, for a given latency at each driver-receiver pair comprising:
   determining whether a node in the topology is a leaf, assigning covers if the node is a leaf, and eliminating inferior covers taking into account a difference in interconnect latency associated with the covers;
   determining whether the node in the topology comprises a branch, assigning covers to the node if the node comprises a branch by inserting wires and clocked and non-clocked repeaters and eliminating inferior covers taking into account a difference in interconnect latency associated with the covers;
   determining whether the node in the topology comprises a first branch and a second branch;
   assigning covers to each node in the first branch and the second branch;
   determining if covers in the first branch have same cycle latency as covers in the second branch;
   inserting at least a minimum number of extra flip-flops in the branch with lower latency if no covers in the first branch have same cycle latency as covers in the second branch;
   merging covers of the first branch and the second branch to form a merged branch; and
   eliminating inferior covers of the merged branch taking into account a difference in interconnect latency associated with the covers.

20. The method of claim 19 wherein assigning covers comprises:
   computing a 4-tuple defined as $\gamma_i=(c_i,r_i,\lambda_i,a_i)$ where $c_i$ is an input capacitance seen at node i, $r_i$ is a required arrival time at a node after a positive edge of a clock signal $\phi$ with period $T_\phi$, $\lambda_i$ is the interconnect latency defined as a maximum number of clocked repeaters crossed when going from the driver of $\Theta_i$ to the receiver, and $a_i$ is the repeater assignment at the node.

21. The method of claim 20 wherein computing a 4-tuple defined as $\gamma_i=(c_i,r_i,\lambda_i,a_i)$ comprises using a clock skew matrix to compute the 4-tuple.

22. The method of claim 21 wherein using the clock skew matrix to compute the 4-tuple comprises modeling a clock distribution network of a die as a grid of n independent domains $\Delta_i$ distributed over the die; and representing the clock skew as an upper triangular matrix $\Sigma$ where an element $\sigma_{i,j}$ in the grid represents the clock skew between domains $\Delta_i$ and $\Delta_j$.

23. The method of claim 20 further comprising:
   computing the difference in latency between the first branch and the second branch if no covers in the first branch have same cycle latency as covers in the second branch; and
   adding at least one or more flip-flops to the branch with the lower latency so that there are at least one cover in the first branch and at least one cover in the second branch that have same cycle latency.

24. A system to insert one or more repeaters in a topology for a given latency at each driver-receiver pair comprising:
   a memory;
   a processor; and
   a bus coupled to the memory and the processor, the processor to:
   determine whether a node in the topology is a leaf, to assign covers if the node is a leaf, and to eliminate inferior covers taking into account a difference in interconnect latency associated with the covers;
   determine whether the node in the topology comprises a branch, to assign covers to the node if the node comprises a branch, by inserting wires and clocked and non-clocked repeaters and to eliminate inferior covers taking into account a difference in interconnect latency associated with the covers;
   determine whether the node in the topology comprises a first branch and a second branch;
   assign covers to each node in the first branch and the second branch;
   determine if covers in a first branch have same cycle latency as covers in the second branch;
   introducing at least a minimum number of extra flip-flops in the branch with lower latency if no covers in the first branch have same cycle latency as covers in the second branch;
   merge covers of the first branch and the second branch to form a merged branch; and
   eliminate inferior covers of the merged branch taking into account a difference in interconnect latency associated with the covers.

25. The system of claim 24 wherein the processor to assign a cover comprises the processor to compute a 4-tuple defined as $\gamma_i=(c_i,r_i,\lambda_i,a_i)$ where $c_i$ is an input capacitance seen at node i, $r_i$ is a required arrival time at a node after a positive edge of a clock signal $\phi$ with period $T_\phi$, $\lambda_i$ is the interconnect latency defined as a maximum number of clocked repeaters crossed when going from the driver of $\Theta_i$ to the receiver, and $a_i$ is the repeater assignment at the node.

26. The system of claim 25 wherein the processor to compute a 4-tuple defined as $\gamma_i=(c_i,r_i,\lambda_i,a_i)$ comprises the processor to use a clock skew matrix to compute the 4-tuple.

27. The system of claim 26 wherein the processor to use the clock skew matrix to compute the 4-tuple comprises the processor to model a clock distribution network of a die as a grid of n independent domains $\Delta_i$ distributed over the die;

and the processor to represent the clock skew as an upper triangular matrix $\Sigma$ where an element $\sigma_{i,j}$ in the grid represents the clock skew between domains $\Delta_i$ and $\Delta_j$.

28. The system of claim 24 further comprising the processor to compute the difference in latency between the first branch and the second branch if no covers in the first branch have same cycle latency as covers in the second branch; and the processor to add one or more flip-flops to the branch with the lower latency so that there are at least one cover in the first branch and at least one cover in the second branch that have same cycle latency.

29. An article of manufacture to insert one or more repeaters in a topology, for a given latency at each driver-repeater pair comprising:

a machine-accessible medium including instructions that, when executed by a machine, causes the machine to perform operations comprising:

determining whether a node in the topology is a leaf, assigning covers if the node is a leaf, and eliminating inferior covers taking into account a difference in interconnect latency associated with the covers;

determining whether the node in the topology comprises a branch, assigning covers to the node if the node comprises a branch by inserting wires and clocked and non-clocked repeaters, and eliminating inferior covers taking into account a difference in interconnect latency associated with the covers;

determining whether the node in the topology comprises a first branch and a second branch;

assigning covers to each node in the first branch and the second branch;

determining if covers in a first branch have same cycle latency as covers in the second branch;

introducing at least a minimum number of extra flip-flops in the branch with lower latency if no covers in the first branch have same cycle latency as covers in the second branch;

merging covers of the first branch and the second branch to form a merged branch; and eliminating inferior covers of the merged branch taking into account a difference in interconnect latency associated with the covers.

30. The article of manufacture of claim 29 wherein said instructions for assigning a cover comprise further instructions for:

computing a 4-tuple defined as $\gamma_i=(c_i,r_i,\lambda_i,a_i)$ where $c_i$ is an input capacitance seen at node i, $r_i$ is a required arrival time at a node after a positive edge of a clock signal $\phi$ with period $T_\phi$, $\lambda_i$ is the interconnect latency defined as a maximum number of clocked repeaters crossed when going from the driver of $\Theta_i$ to the receiver, and $a_i$ is the repeater assignment at the node.

31. The article of manufacture of claim 30 wherein said instructions for computing a 4-tuple defined as $\gamma_i=(c_i,r_i,\lambda_i,a_i)$ comprise further instructions for using a clock skew matrix to compute the 4-tuple.

32. The article of manufacture of claim 31 wherein said instructions for using the clock skew matrix to compute the 4-tuple comprise further instructions for modeling a clock distribution network of a die as a grid of n independent domains $\Delta_i$ distributed over the die; and representing the clock skew as an upper triangular matrix $\Sigma$ where an element $\sigma_{i,j}$ in the grid represents the clock skew between domains $\Delta_i$ and $\Delta_j$.

33. The article of manufacture of claim 29 comprising further instructions for computing the difference in latency between the first branch and the second branch if no covers in the first branch have same cycle latency as covers in the second branch; and adding at least one or more flip-flops to the branch with the lower latency so that there are at least one cover in the first branch and at least one cover in the second branch that have same cycle latency.

* * * * *

UNITED STATES PATENT AND TRADEMARK OFFICE
CERTIFICATE OF CORRECTION

PATENT NO. : 6,910,196 B2
DATED : June 21, 2005
INVENTOR(S) : Pasquale Cocchini

It is certified that error appears in the above-identified patent and that said Letters Patent is hereby corrected as shown below:

Title page,
Item [56], References Cited, OTHER PUBLICATIONS,
"Mehta et al.," reference, delete "Comput" and insert -- Computer --, therefor.
"Lin et al.," reference, delete "Internationa" and insert -- International --, therefor.

Column 11,
Line 35, after "to" insert -- : --.
Line 61, delete "$\gamma_l$" and insert -- $\gamma_i$ --, therefor.

Column 12,
Line 19, delete "cost($\gamma$)>cost($\gamma$)" and insert -- cost($\gamma$)>cost($\gamma'$) --, therefor.

Column 13,
Line 21, delete "cost($\gamma$)>cost($\gamma$)" and insert -- cost($\gamma$)>cost($\gamma'$) --, therefor.

Signed and Sealed this

Eighteenth Day of October, 2005

JON W. DUDAS
*Director of the United States Patent and Trademark Office*